(12) United States Patent
Poon et al.

(10) Patent No.: US 9,053,938 B1
(45) Date of Patent: Jun. 9, 2015

(54) HIGH LIGHT TRANSMISSION, LOW SHEET RESISTANCE LAYER FOR PHOTOVOLTAIC DEVICES

(75) Inventors: Hak Fei Poon, Sunnyvale, CA (US);
Tianyue Yu, Sunnyvale, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 0 days.

(21) Appl. No.: 12/901,470

(22) Filed: Oct. 8, 2010

Related U.S. Application Data

(60) Provisional application No. 61/249,992, filed on Oct. 8, 2009.

(51) Int. Cl.
   *H01L 21/00* (2006.01)
   *H01L 21/02* (2006.01)

(52) U.S. Cl.
   CPC .... *H01L 21/02603* (2013.01); *H01L 21/02606* (2013.01)

(58) Field of Classification Search
   CPC ............... H01L 21/02603; H01L 21/02606; H01L 2221/1094
   USPC ................. 438/29, 69; 257/95, 98, 100, 432, 257/E33.067, E33.07, E33.074
   See application file for complete search history.

(56) References Cited

U.S. PATENT DOCUMENTS

| | | | |
|---|---|---|---|
| 2002/0026956 A1* | 3/2002 | Hanehira et al. | 136/256 |
| 2004/0219730 A1 | 11/2004 | Basol | |
| 2005/0183767 A1 | 8/2005 | Yu et al. | |
| 2006/0160261 A1* | 7/2006 | Sheats et al. | 438/34 |
| 2007/0186971 A1 | 8/2007 | Lochun et al. | |
| 2009/0309481 A1* | 12/2009 | Chou et al. | 313/483 |
| 2010/0089447 A1* | 4/2010 | Basol et al. | 136/256 |

OTHER PUBLICATIONS

U.S. Appl. No. 61/249,992, to Hak Fei Poon, filed Oct. 8, 2009.

* cited by examiner

*Primary Examiner* — Su C Kim
(74) *Attorney, Agent, or Firm* — Joshua D. Isenberg; JDI Patent

(57) ABSTRACT

Methods and devices are provided for forming a low-resistance, high light transmission layer. In one embodiment of the present invention, a method is provided comprised of creating a plurality of vias on a substrate, the vias formed in material that has a maximum processing temperature that less than a pre-defined threshold; adding a plurality of electrically conductive material into the vias; and solution depositing a nanowires infused window layer that has a first thickness at certain areas and a second thickness at other areas, wherein overall sheet resistance is between about 1 to 10 ohms per square, while light transmission combined is at least 70% and creates less than 5% shadow loss. The method may involve using a transparent conductive oxide layer beneath the window layer. This can create a layer that eliminates opaque bus bars or fingers associated with traditional solar cells. This may be an all-solution deposited process using only one deposition set or multiple deposition steps.

19 Claims, 6 Drawing Sheets

HIGH LIGHT TRANSMISSION, LOW SHEET RESISTANCE LAYER FOR PHOTOVOLTAIC DEVICES

CROSS-REFERENCE TO RELATED APPLICATION

This application claims priority to U.S. Provisional Application Ser. No. 61/249,992 filed Oct. 8, 2009 and fully incorporated herein by reference for all purposes.

FIELD OF THE INVENTION

This invention relates to optoelectronic devices and more particularly to layers with improved electrical conductivity and high light transmission for optoelectronic devices such as solar cells.

BACKGROUND OF THE INVENTION

Optoelectronic devices can convert radiant energy into electrical energy or vice versa. These devices generally include an active layer sandwiched between two electrodes, sometimes referred to as the front and back electrodes, at least one of which is typically transparent. The active layer typically includes one or more semiconductor materials. In a light-emitting device, e.g., a light-emitting diode (LED), a voltage applied between the two electrodes causes a current to flow through the active layer. The current causes the active layer to emit light. In a photovoltaic device, e.g., a solar cell, the active layer absorbs energy from light and converts this energy to electrical energy exhibited as a voltage and/or current between the two electrodes. Large scale arrays of such solar cells can potentially replace conventional electrical generating plants that rely on the burning of fossil fuels. However, in order for solar cells to provide a cost-effective alternative to conventional electric power generation the cost per watt generated may be competitive with current electric grid rates. Currently, there are a number of technical challenges to attaining this goal.

Most conventional solar cells rely on silicon-based semiconductors. In a typical silicon-based solar cell, a layer of n-type silicon (sometimes referred to as the emitter layer) is deposited on a layer of p-type silicon. Radiation absorbed proximate the junction between the p-type and n-type layers generates electrons and holes. The electrons are collected by an electrode in contact with the n-type layer and the holes are collected by an electrode in contact with the p-type layer. Since light may reach the junction, at least one of the electrodes may be at least partially transparent. Many current solar cell designs use a transparent conductive oxide (TCO) such as indium tin oxide (ITO) as a transparent electrode.

A further problem associated with existing solar fabrication techniques arises from the fact that individual optoelectronic devices produce only a relatively small voltage. Thus, it is often necessary to electrically connect several devices together in series in order to obtain higher voltages in order to take advantage of the efficiencies associated with high voltage, low current operation (e.g. power transmission through a circuit using relatively higher voltage, which reduces resistive losses that would otherwise occur during power transmission through a circuit using relatively higher current).

Several designs have been previously developed to interconnect solar cells into modules. For example, early photovoltaic module manufacturers attempted to use a "shingling" approach to interconnect solar cells, with the bottom of one cell placed on the top edge of the next, similar to the way shingles are laid on a roof. Unfortunately the solder and silicon wafer materials were not compatible. The differing rates of thermal expansion between silicon and solder and the rigidity of the wafers caused premature failure of the solder joints with temperature cycling.

A further problem associated with series interconnection of optoelectronic devices arises from the high electrical resistivity associated with the TCO used in the transparent electrode. The high resistivity restricts the size of the individual cells that are connected in series. To carry the current from one cell to the next the transparent electrode is often augmented with a conductive grid of busses and fingers formed on a TCO layer. However, the fingers and busses produce shadowing that reduces the overall efficiency of the cell. In order for the efficiency losses from resistance and shadowing to be small, the cells may be relatively small. Consequently, a large number of small cells may be connected together, which requires a large number of interconnects and more space between cells. Arrays of large numbers of small cells are relatively difficult and expensive to manufacture. Further, with flexible solar modules, shingling is also disadvantageous in that the interconnection of a large number of shingles is relatively complex, time-consuming and labor-intensive, and therefore costly during the module installation process.

To overcome this, optoelectronic devices have been developed with electrically isolated conductive contacts that pass through the cell from a transparent "front" electrode through the active layer and the "back" electrode to an electrically isolated electrode located beneath the back electrode. U.S. Pat. No. 3,903,427 describes an example of the use of such contacts in silicon-based solar cells. Although this technique does reduce resistive losses and can improve the overall efficiency of solar cell devices, the costs of silicon-based solar cells remains high due to the vacuum processing techniques used in fabricating the cells as well as the expense of thick, single-crystal silicon wafers. However, even these designs create some shadow loss and often involve more elaborate manufacturing techniques involving high accuracy alignment of the traces to be pringed.

Due to the aforementioned issues, improved techniques are desired so that improved photovoltaic cells are manufactured. Improvements may be made to increase the active area of the underlying solar cell without significantly reducing electrical conductivity. The improved device performance and increased production throughput should increase market penetration and commercial adoption of such products.

SUMMARY OF THE INVENTION

Embodiments of the present invention address at least some of the drawbacks set forth above. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a method is provided comprised of creating a plurality of vias on a substrate, the vias formed in material that has a maximum processing temperature that less than a pre-defined threshold; adding a plurality of electrically conductive material into the vias; and solution depositing a nanowires infused window layer that has a first thickness at certain areas and a second thickness at other areas, wherein overall sheet resistance is between about 1 to 10 ohms per square, while light transmission combined is at least 70% and creates less than 5% shadow loss. The method may involve using a transparent conductive oxide layer beneath the window layer. This can create a layer that eliminates opaque bus bars or fingers associated with traditional solar cells. This may be an all-solution deposited process using only one deposition set or multiple deposition steps.

In another embodiment of the present invention, a window layer having areas of a first thickness and areas of a second thickness has a combined sheet resistance to eliminate fingers that is about 10 ohms per square or less. Optionally, the combined sheet resistance is about 9 ohms per square or less. Optionally, the combined sheet resistance is about 8 ohms per square or less. Optionally, the combined sheet resistance is about 7 ohms per square or less. Optionally, the combined sheet resistance is about 6 ohms per square or less. Optionally, the combined sheet resistance is about 5 ohms per square or less. Optionally, the combined sheet resistance is about 4 ohms per square or less. Optionally, the combined sheet resistance is about 3 ohms per square or less. Optionally, the combined sheet resistance is about 2 ohms per square or less. Optionally, the combined sheet resistance is about 1 ohms per square or less. Optionally, the combined sheet resistance is about 0.5 ohms per square or less.

The above-reference sheet resistance also has a high overall light transmission. With regards to light transmission, this may be a function of layer thickness and density of nanowires or conductive material in the layer. One embodiment of the layer has a 1 to 10 ohm per square sheet resistance while having light transmission in the range of about 55% to 90%. Optionally, the layer has a 1 to 10 ohm per square sheet resistance while having light transmission in the range of about 50% to 90%. Optionally, the layer has a 1 to 5 ohm per square sheet resistance while having light transmission in the range of about 60% to 80%. Optionally, the layer has a 2 to 5 ohm per square sheet resistance while having light transmission in the range of about 70% to 90%. Optionally, the layer has a 1 to 2 ohm per square sheet resistance while having light transmission of up to 80% light transmission.

In another embodiment of the present invention, a method is provided comprising creating a plurality of vias on a substrate, the vias formed in material that has a maximum processing temperature that is less than a pre-defined threshold; adding a plurality of electrically conductive material into the vias; and depositing (by any technique) a nanowire infused window layer that has a first thickness at certain areas and a second thickness at other areas, wherein the nanowires form a percolating network to conduct laterally across the layer and wherein overall sheet resistance is between about 1 to 10 ohms per square, while light transmission combined is at least 70% and creates less than 5% shadow loss.

Any of the embodiments herein can be modified to include one or more of the following features. By way of non-limiting example, the method may include using a transparent conductive oxide layer beneath the nanowires infused window layer. Optionally, the transparent conductive oxide layer is comprised of Al—ZnO. Optionally, the transparent conductive oxide layer is comprised of ZMO. Optionally, the transparent conductive oxide layer is comprised of ITO. Optionally, the solution comprises of between 0.5 to 1.0% by weight of metal nanowires in a solvent with 0.5 to 1.0% binder. Optionally, the solution comprises of between 0.1 to 2.0% by weight of metal nanowires in a solvent with 0.2 to 1.5% binder Optionally, the nanowires each have a length between 10 to 100 microns and diameter of 20 to 200 nm Optionally, the nanowires each have a length between 50 to 200 microns and diameter of 50 to 200 nm. Optionally, maximum horizontal distance between areas of first thickness of higher electrical conductivity is at least 10% less than a diameter of the via. Optionally, maximum horizontal distance between areas of first thickness of higher electrical conductivity is at least 20% less than a diameter of the via. Optionally, maximum horizontal distance between areas of first thickness of higher electrical conductivity is at least 30% less than a diameter of the via. Optionally, the difference between first thickness and second thickness is achieved by printing a uniform thickness layer conforming to the second thickness and printing an additional layer at pre-determined areas to increase aggregate thickness to the first thickness. Optionally, depressions are created by the reduced thickness of the second thickness creates cavities on an upper surface of the nanowires infused window layer. Optionally, underlying layer of material is shaped to have large plateau areas and narrow valley areas which created areas of increased thickness for higher conductivity. Optionally, the first thickness is greater than the second thickness, wherein the first thickness also has increased nanowire density due to application of a different solution of nanowires in those areas of the first thickness. Optionally, the first thickness is greater than the second thickness, wherein light transmission is at least 50% in areas of the first thickness. Optionally, the first thickness is greater than the second thickness, wherein light transmission is at least 60% in areas of the first thickness. Optionally, no opaque grid lines are used and wherein the first thickness is greater than the second thickness, wherein light transmission is at least 50% in areas of the first thickness. Optionally, two or more coating steps are used to create areas of greater thickness.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

In one embodiment of the present invention, back contact thin film solar cell structures and processes are described. In this embodiment of the solar cell structure, the transparent electrode is electrically connected through vias to a backside electrode, which is a metal foil that is capable of carrying more current than the transparent electrode and costs much less. This allows a thinner, less expensive top electrode, and also affords much greater design flexibility for the cell and module.

Figure 1:
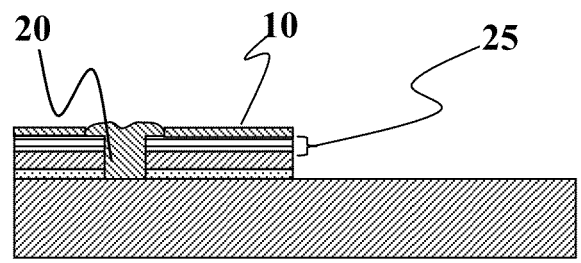
FIG. 1 shows a side view of one embodiment of the present invention.

Referring now to FIG. 1, a cross-sectional view of one embodiment of the present invention will now be described. Although the electrically conductive, high light transmission layer 10 is shown with the present solar cell structure, it should be understood that such a layer 10 can be used in any solar cell that employs a conventional window layer. In this current embodiment, the layer 10 will be in contact with electrically conductive material 20 in vias that coupled to an electrically conductive back side layer 30. Some embodiments, the vias are only partially filled (or only side walls coated) with electrically conductive material. The active layer 25 is beneath the layer 10 and the increased light transmission of overlying layer 10 will increase either the active area of the active layer 25, increase the amount of light transmitted to the active layer 25, or both. Additional details regarding the cell structure may be found in U.S. patent application Ser. No. 11/278,645 filed Apr. 4, 2006 and fully incorporated herein by reference for all purposes.

Figure 2:
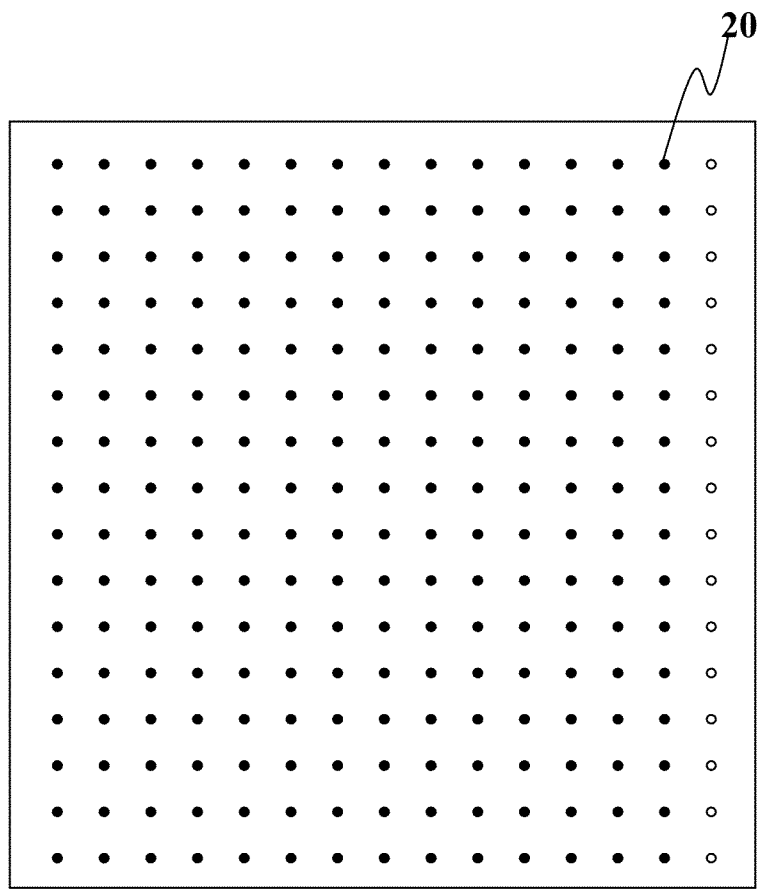
FIG. 2 shows a top down plan view showing a substrate having a plurality of vias according to one embodiment of the present invention.

FIG. 2 shows a top down plan view of one embodiment of a partially completed solar cell showing an array of vias filled or partially filled with electrically conductive material. In some other embodiments, there may be electrically conductive traces or fingers extending outward such as but not limited to radially from each of the filled vias. These traces or fingers were typically formed of opaque electrically conductive material such as epoxy based silver inks Silver, however, is relatively expensive and the opaque quality of the fingers and traces still contribute to shading loss. Although such loss of active area may be minimized to be in the range from about 3-10%, it is still area that is lost, which decreases overall device efficiency. In addition, the mechanical properties of the cured adhesive may not be ideal with respect to the other materials: the best such inks are epoxy-based, and epoxies are relatively stiff polymers. If the adhesive between the two electrodes is softer, then too much stress may be placed on the via ink, causing it to break and fail.

Figure 3:
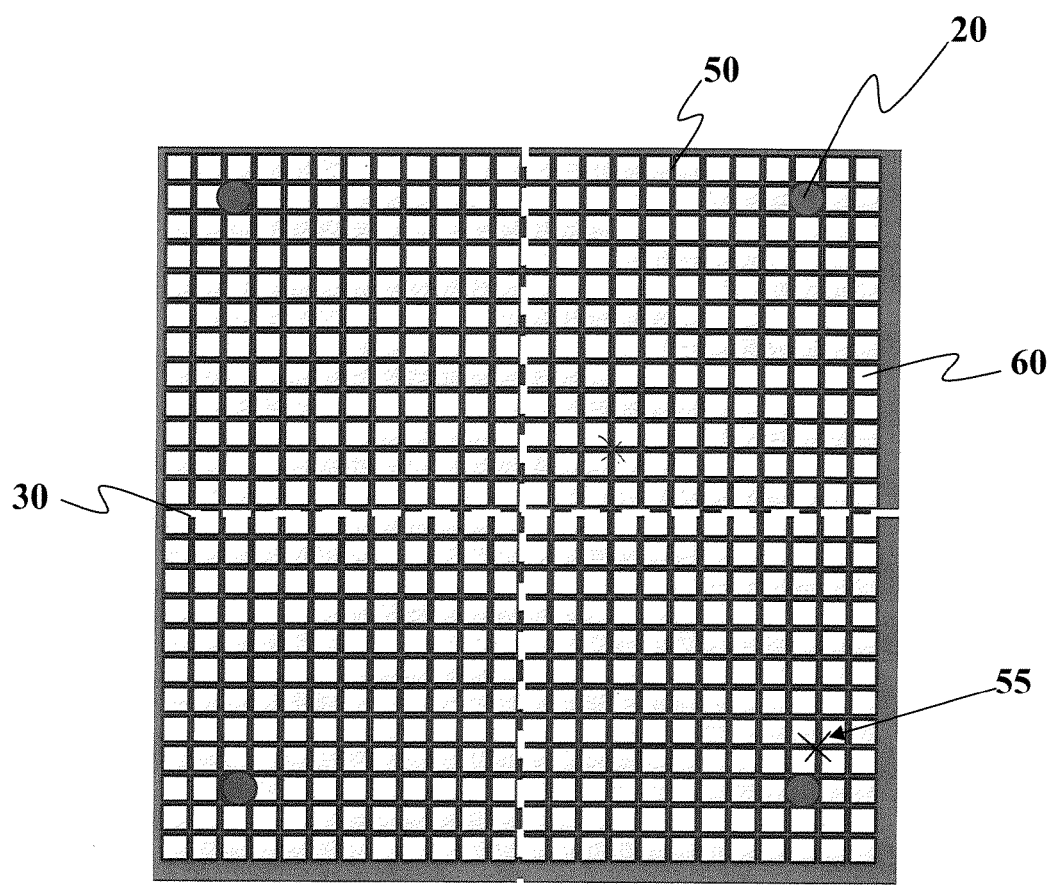
FIG. 3 shows a top down plan view of one embodiment of the present invention wherein areas of increased layer thickness show that the lines of increased thickness are at a pitch that ensures contact with a via.

Referring now to FIG. 3, one embodiment of the present invention will now be described. This embodiment shows that one method of increasing active area efficiency involves using a replacement layer of high light transmission, electrically conductive material. FIG. 3 shows that the vias 30 in the solar cell are under a layer 10 comprised of a layer nanowires with increased conductivity at lines 50 and reduced conductivity (but increased light transmission) in areas 60. In one embodiment, the reduced electrical conductivity is due to the reduced thickness of material and thus, the number of nanowires available to carry current in that particular area. Optionally, other embodiments may use different nanowires or materials at these reduced current areas or has nanowires dispersed in reduced density.

As seen in FIG. 3, the vias 30 are intersected by or in contact with the lines 50. In this manner, there is a high electrical conductivity pathway (by way of these lines 50 with higher amounts of nanowires) from the areas of less conductivity 60 to the lines 50 and then to the vias 30. By way of example but not limitation, the "pitch" of the lines 50 may be selected so at least one of the lines 50 is guaranteed to intersect a via 30 in at least one axis. Some embodiments are configured so that the lines 50 are at a spacing or orientation that a via 30 will be in direct electrical contact with a line 50 in each of the axis that lines 50 are oriented. Thus for FIG. 3, the via 30 is in contact with a line 50 along one axis and at least one line 50 in an orthogonal axis. Some embodiments select a pitch or spacing that is less than the diameter or largest dimension of the via, as viewed from a top down plan view. By way of non-limiting example, via diameter may be in the range of about 250 to 750 nm. In one embodiment, via diameter is about 500 nm. The pitch or spacing of the grid lines may be about ½ the diameter of the via. FIG. 3 also shows that in some embodiments the grid lines are not continuous but may have breaks 33 to electrically isolate the high conductivity pathways in layer 10 for each via. For ease of illustration, only a few breaks are shown, but it should be understood that layer 10 may be configured so that there are "breaks" along each high conductivity line 50 in every direction so that lines from one via do not directly connect to lines from another via.

The embodiment of FIG. 3 may use a variety of different coatings including but not limited to nanowires coating to form the layer 10. The nanowires are more like a capillary system. The nanowires in the layer 10 will collect charge from the underlying active layer and as more charge is collected, they are directed towards the higher conductivity grid lines 50. By way of nonlimiting example, these larger lines are thicker layers of nanowires, areas having micro wires, thicker layers of microwires, or areas of thicker nanowires or microwires but same layer thickness. This layer 10 differs from existing systems as the areas occupied by lines 50 are as electrically conductive as traditional opaque busbars, but instead, these areas still have light transmission of a predetermined level. In one embodiment, light transmission through lines 50 is at least 75%. Optionally, light transmission through lines 50 is at least 70%. Optionally, light transmission through lines 50 is at least 60%. Optionally, light transmission through lines 50 is at least 50%. Optionally, light transmission through lines 50 is at least 40%. Optionally, light transmission through lines 50 is at least 30%. Optionally, light transmission through lines 50 is at least 20%. All the while, the sheet resistance is no more than 10 ohms per square. Optionally, the sheet resistance is no more than 5 ohms per square. Optionally, the sheet resistance is no more than 4 ohms per square. Optionally, the sheet resistance is no more than 3 ohms per square. Optionally, the sheet resistance is no more than 2 ohms per square. Optionally, the sheet resistance is no more than 1 ohm per square.

In one embodiment, there are several different inks, one or more for each stage or layer. This can create a hierarchy of conductive levels based on loading, type of nanowires or conductive material, etc. . . . . . The current transfer "highway" can create a network of many small conductive pathways upwards towards larger, more conductive pathways (highway, state roads, local roads, etc. . . . ).

In another embodiment, instead of using multiple different inks, a single ink may be used but manipulated to adjust transmission and sheet resistance. In this embodiment, a technique for forming the layer 10 may involve depositing one or more coatings of a uniform liquid film containing nanowires and/or microwires. Then method may involve modulating film thickness by some sort of impression using mechanical techniques such as but not limited to liquid meniscus; liquid embossing, stamp, rubber stamp, or the like. Areas of thinner and thicker are created in the layer 10.

After embossing or shaping of the layer 10, it is a competition between kinetics of drying and surface tension to pull the liquid back to level. If it is possible to defeat the drying kinetics, the greater the gradation between the areas of thick and thin. One technique may involve "freezing" the liquid meniscus immediately after deposition using increased heat or cooling to active temperature sensitive material in the layer 10. Optionally, there may be drying of the layer much faster before surface tension tries to levelize the shaped layer 10.

In such a manner, a large area coating 10 is created with modulated nanowire density at different locations. Thicker film has more nanowires, with increased electrical conductivity. Thicker nanowire regions such as lines 50 can act as a replacement for the fingers of opaque conductor used in known devices. If the pitch of the thicker region less than the via size, then no need to align (just blanket coat). There is a guarantee that the line 50 will hit a via 30. Higher nanowire density or just more nanowires through increased layer thickness can be used in the lines 50.

Optionally, instead of using a single print of a thick layer that is embossed to have areas of thick and thin, another technique may involve printing a first layer in a first state and then in a second stage, print a patterned layer with the grid lines. Thus in the first state, a blank coat at low density is provided and at the second stage, a blank coat at high density is provided.

In one embodiment, the configuration uses a layer 10 that contains substantially no opaque conductors and can be solution deposited in a continuous manner, which has its advantages. In one aspect, there is the ability to modulate the light transmission. Higher light transmission can be achieved at the thin areas which will improve performance of the underlying active layer. Having a thick layer of material 10 at all areas is typically an over-designing of the conductivity for such a layer. The higher conductivity areas are located only at areas once sufficient charge is gathered for the thinner areas and more current is being carried toward the vias 30.

Furthermore by using this embodiment, low sheet resistance can be achieved at same or better light transmission. Because the technique can modulate the low density and high density area, electron transfer is much more efficient at high density area while light transmission is still possible at both high and low density areas. Electron transfer at low density is fine because they are responsible for a smaller areas. Once the electrons reach any of those lines 50, the resistivity is very low. So at any given transmission, this will give you a lower sheet resistance. Or optionally, at a given sheet resistance, the device will have a higher light transmission.

As the nanowires density is increased, the sheet resistance will go down at the cost of decreased transmission. In one embodiment, the combined sheet resistance to eliminate fingers is about 10 ohms per square or less. Optionally, the combined sheet resistance is about 9 ohms per square or less. Optionally, the combined sheet resistance is about 8 ohms per square or less. Optionally, the combined sheet resistance is about 7 ohms per square or less. Optionally, the combined sheet resistance is about 6 ohms per square or less. Optionally, the combined sheet resistance is about 5 ohms per square or less. Optionally, the combined sheet resistance is about 4 ohms per square or less. Optionally, the combined sheet resistance is about 3 ohms per square or less. Optionally, the combined sheet resistance is about 2 ohms per square or less. Optionally, the combined sheet resistance is about 1 ohms per square or less. Optionally, the combined sheet resistance is about 0.5 ohms per square or less.

Figure 4:
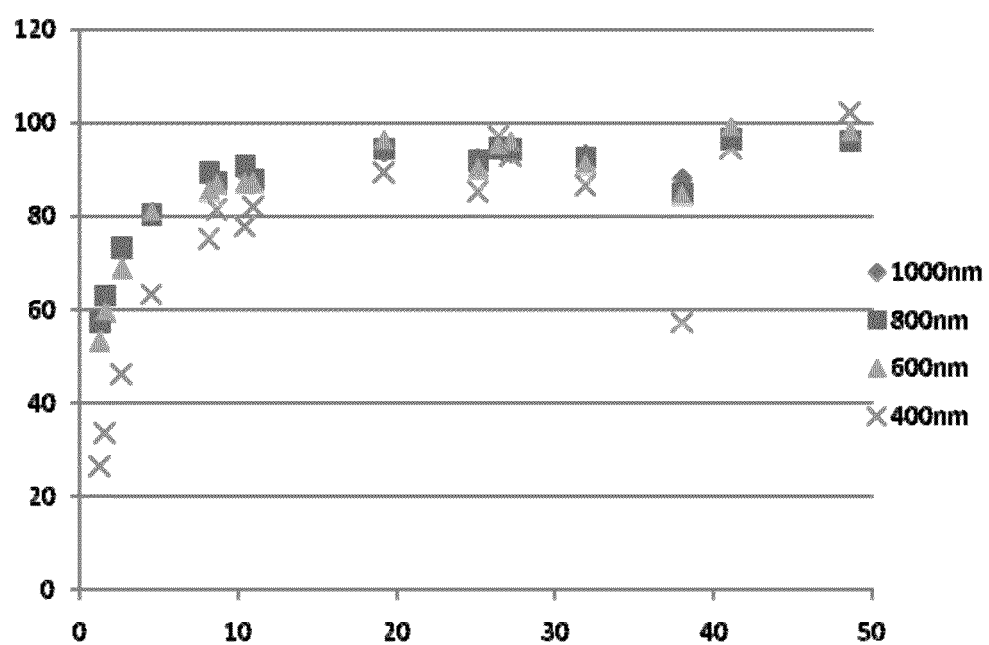
FIG. 4 shows a graph showing features from various embodiments of the present invention.

Referring now to FIG. 4, a graph is provided showing sheet resistance versus light transmission for various thickness coatings of the layer 10. With regards to light transmission, this may be a function of layer thickness and density of nanowires in the layer. As seen in FIG. 4, a thicker layer (800 nm) can achieve a 1 to 10 ohm per square sheet resistance while having light transmission in the range of about 55% to 90%. A thinner layer (600 nm) can achieve a 1 to 10 ohm per square sheet resistance while having light transmission in the range of about 50% to 90%. In one embodiment, the formulation used for low $R_{sh}$ is 1% NW, 0.6% HPMC in Water (by weight). Optionally, the lowest $R_{sh}$ (0.63) film can be manufactured by coating four times at 1000 rpm for 60 sec. The nanowires may be metal nanowires such as but not limited to silver, gold, cooper, combinations thereof, or other electrically conductive metal or alloy. They may be of the just one material or may be coated nanowires such as metal of any of the foregoing coated with gold or other corrosion or oxidation resistant material. The nanowires may be sized in the range of about 30-200 nm in diameter with length from 300 to 50000 nm. Although most of the embodiments herein are described in terms of nanowires, other particles or shapes may be used so long as they can be connected to form a percolating network that will allow for electrical conductivity through the network.

Figure 5:
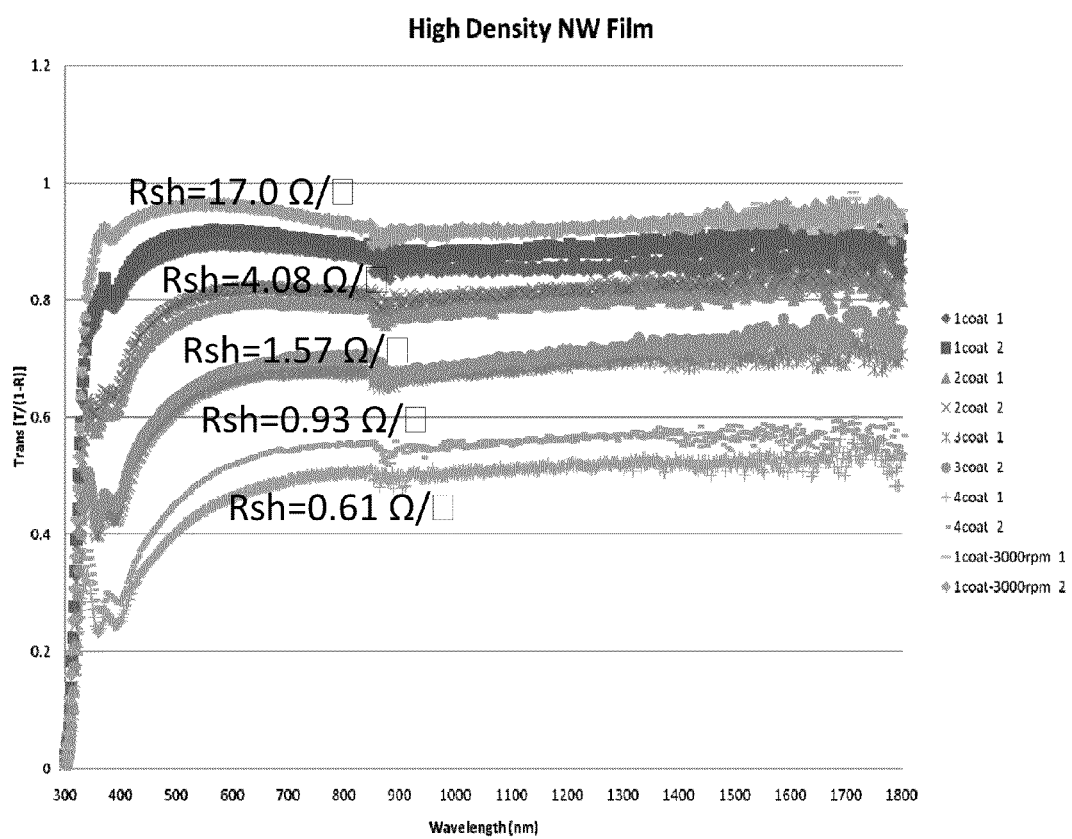
FIG. 5 shows a graph showing features from various embodiments of the present invention.
Figure 6:
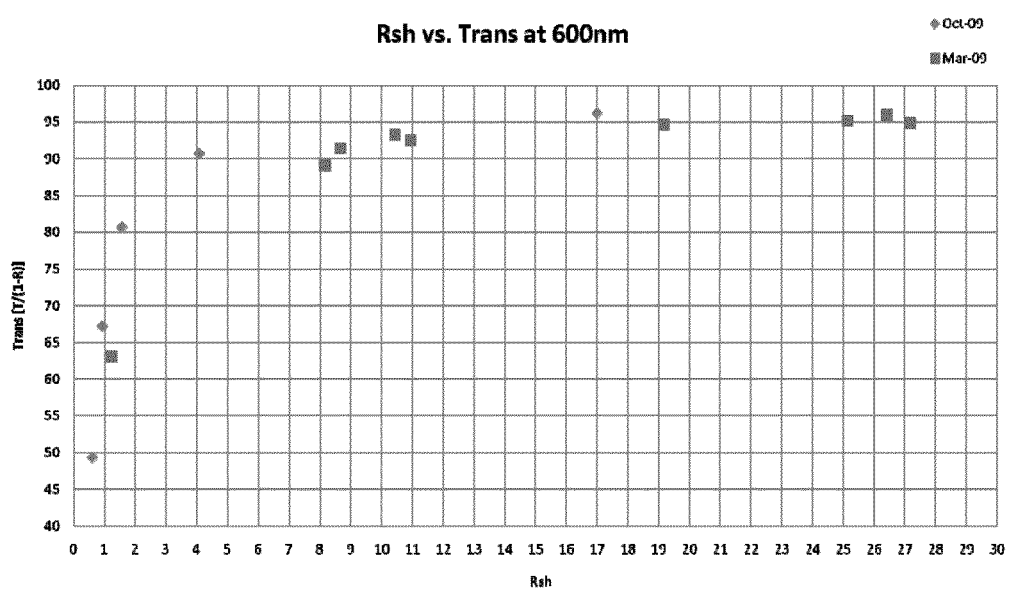
FIG. 6 shows a graph showing sheet resistance and transparency according to embodiments of the present invention.

Referring now to FIG. 5, a graph is provided showing light transmission over various wavelengths for various thickness coatings of the layer 10. The sheet resistance for each layer is also included. As seen here, the layer with sheet resistance of 1.57 ohms per square still had light transmission as high as 70% in the visible spectrum of 400 to 700 nm.

But, it should be understood that not everywhere on the window layer needs such low sheet resistance. In some embodiments, this would overdesign the system. If one were to make everywhere that conductive, it may not be necessary and would decrease the efficiency of the device and suffer from photocurrent loss due in part to decreased transmission. In many but not all embodiments, it is desirable to keep most of the area at a normal nanowire density and/or layer thickness, but with select areas that mimic current loss of finger, increased numbers of nanowires are used that would optimize design. Conductivity at the grid lines is very conductive and can be tuned to be comparable to the conductivity of opaque grid lines. The grid lines 50, in one embodiment of the present invention, are at least 50% transparency (vs 0% for transmission for opaque silver grid lines). Thus these grid finger are still light translucent and thus will increase the active area of the solar cell, which would otherwise be shaded by the opaque grid material. More electrons due to less shadow loss from finger. 50% translucent finger. Increase active area of the cell from these fingers.

Furthermore, from a processing standpoint, the grid design herein also eliminates alignment issue with the vias. This is a much higher throughput. Whether done in single stage or dual stage print. Another advantage, right now fingers are localized to each via. Also, some embodiment could have individual, discrete fingers per via, alignment is still much better (in the range of cm's) due to the much more relaxed tolerances due to the pitch. In the present embodiment, when light transmission goes from 70% to 50% transmission, the electrical conductivity will be close to silver. As seen in FIGS. 4 and 5, the relationship between electrical conductivity and nanowire layer 10 light transmission is nonlinear.

In one embodiment, sheet resistance is about 80-100 ohm per square in the thinner areas on layer 10 between the lines 50. Combined, the layer 10 with areas of high conductivity and areas of reduced conductivity has a sheet resistance in one embodiment of 1 to 2 ohms, with at least 90% light transmission in the thinned area. For some embodiments with increased numbers of grid lines and closer pitch spacing, the sheet resistance of the thinned areas and of the lines 50 be even higher resistance since the lines 50 are closer, more numerous, and reduce the size of each thinned area.

In one non-limiting embodiment, the shading loss from the layer 10 is 5%. Optionally, the shading loss from the layer 10 is 4%. Optionally, the shading loss from the layer 10 is 3%. Optionally, the shading loss from the layer 10 is 2%. Optionally, the shading loss from the layer 10 is '%. Optionally, the shading loss from the layer 10 is 0.5%. Transmission is usually related to nanowires per area.

Even if some embodiments get better shading loss, the design using grid lines 50 guaranteed to intersect a via will result in better manufacturing. This embodiment where the grid line will be guaranteed to intersect a via relieves the manufacturing step of aligning each via with each set of grid lines or fingers. Optionally for those embodiments where the grid lines 50 are isolated from grid lines 50 for another via, there remains an alignment step, but the tolerances are significantly relaxed, since the via 30 just needs to be in the area of the grid lines 50, instead of trying to align fingers to the diameter of the via 30. Thus, the alignment is measured in terms of millimeters or even centimeters instead of in terms of microns or nanometers. Such orders of magnitude change will increase throughput during manufacturing and allow for production on continuously moving substrates at 30-50 m per minute.

Referring now to FIGS. 7 through 10, it should be understood that a variety of different cross-sectional profiles may be configured for use with the thick areas and thinned areas of layer 10. It should be understood that any of these configurations may be combined singly or in multiple combinations. It should also be understood that although the embodiments herein are discussed in terms of a thinned area and a thick area, there may be other embodiments with more than just 2 layer thicknesses. Some embodiments may have at least 3 thicknesses for layer 10. Optionally, some embodiments may have at least 4 thicknesses for layer 10. These thicknesses may also combine the various geometric cross-sections shown in FIGS. 7 through 10.

Figure 7:
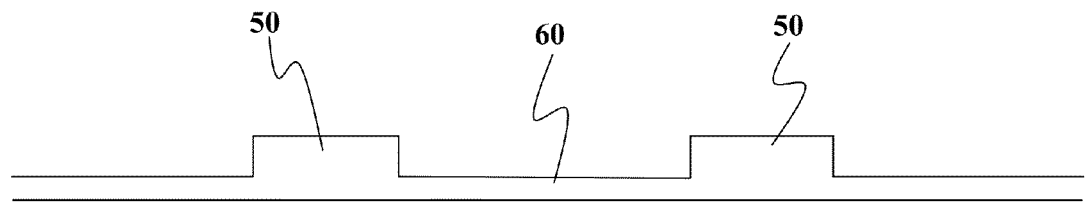
FIGS. 7 through 10 show cross-sectional views of thicknesses of nanowire layers according to embodiments of the present invention.

Referring now to FIG. 7, this embodiment shows a profile that has substantially vertical walls and a "step" like cross-section between thinned areas 60 and lines 50. To achieve this shape, it is desirable to "freeze" or otherwise quickly lock in the shape of the layer 10 after embossing, shaping, or after multiple deposition steps to build up the material. A variety of techniques may be used to lock in the shape. In one embodiment, an additive such as but not limited to a crosslinkable binder is added so that one can increase viscosity if temperature goes up (or down depending on the). Optionally, alone or in combination with other techniques, an embossing plate or roller used to form the shape can be slightly porous, allowing for drying on the spot (with material property to allow for release). Normally embossing requires completely impermeable surfaces. Here, one can do embossing that is impermeable to liquid, but permeable for gas that allows the gas to dry the layer in the desired shape. Some embodiments may use a stencil to print the lines and use UV or other activator to lock the as-deposited material into the desired shape. The UV or other catalyst may be used to lock in the shape as each layer is deposited using any of the techniques herein or after all layers are deposited.

It should also be understood that the lines 50 may be can have different widths and thicknesses. Although the figures show the top down view of the lines 50 are of constant width, they can also be configured to increase in width as the near the vias 30 and are thus carrying more current.

Figure 8:
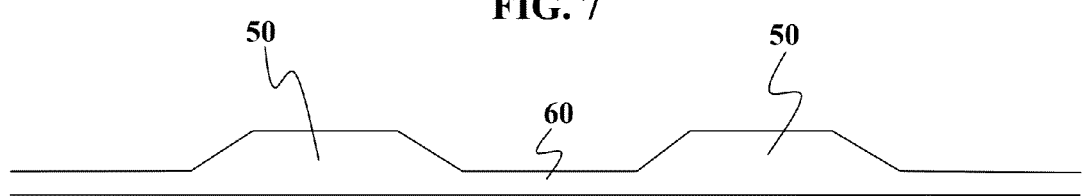
Figure 9:
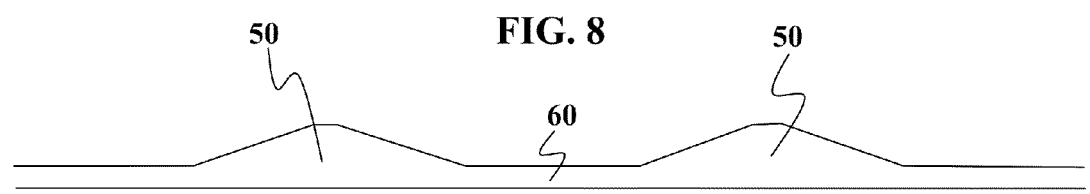
Figure 10:
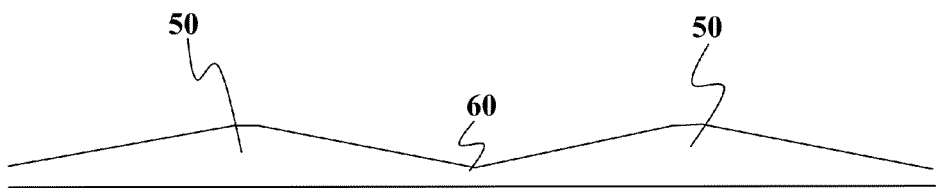

As seen in FIGS. 8 through 10, some embodiments may use a slope or shoulder design. This may actually be more efficient as the photocurrent that is gathered will increase as it nears the grid lines 50. Thus the amount of tuning to optimize light transmission in the thinned areas 60 and the amount of slope heading towards line 50 will depend in part on how far apart the grids line 50 are spaced and in turn, the size of the thinned areas 60.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, traditional grid lines may also be used with some of the vias 30, although to minimize shadow loss, such use is limited to only select areas. In some embodiments, instead of vias, other geometric shapes such as but limited to curved lines, variable width lines, squares or other shapes are used and filled with the conductive material. Furthermore, some areas may have X or other shaped branch like or watershed pattern 55 in the lines 50 (see FIG. 3). This may be at all, some, or only at the vias in the design. Although most embodiments herein show solution deposition techniques, other vacuum or non-vacuum techniques may also be used to deposit materials to assist layer 10. Layer 10 may itself be integrated with or used over a transparent conductive layer such as a TCO, ZnO, ZnMO, ITO, or other transparent conductor as known.

It should also be understood that prior to deposition of any material on the substrate, the metal foil may undergo conditioning (cleaning, smoothening, and possible surface treatment for subsequent steps), such as but not limited to corona cleaning, wet chemical cleaning, plasma cleaning, ultrasmooth re-rolling, electro-polishing, and/or CMP slurry polishing. With regards to nanowires, although most embodiments herein describe nanowires are the materials forming the percolating network, other structural shapes such as nanocubes, nanoparticles, nanorods, or other shapes can be adapted to work to form a percolating network.

Furthermore, those of skill in the art will recognize that any of the embodiments of the present invention can be applied to almost any type of solar cell material and/or architecture. For example, the absorber layer in the solar cell may be an absorber layer comprised of copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Many of these types of cells can be fabricated on flexible substrates. Examples of such solar cells include cells with active absorber layers comprised of silicon (e.g. for amorphous, micro-crystalline, or polycrystalline silicon cells), organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells), copper-indium-gallium-selenium (for CIG solar cells), cells whose active layer is comprised of CdSe, CdTe, and combinations of the above, where the active materials are present in any of several forms including but not limited to bulk materials, micro-particles, nano-particles, or quantum dots. Many of these types of cells can be fabricated on flexible substrates (e.g., stainless steel foil). Although these types of active layers can be manufactured in non-vacuum environments, the intra-cell and inter-cell electrical connection typically requires vacuum deposition of one or more metal conducting layers.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, US 20040219730 and US 2005/0183767 are fully incorporated herein by reference.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
    creating a plurality of vias on a substrate, the vias formed in material that has a maximum processing temperature that is less than a pre-defined threshold;
    creating a transparent conductive oxide layer, wherein the substrate is supporting the transparent conductive oxide layer;
    adding a plurality of electrically conductive material into the vias;
    solution depositing a nanowires infused transparent window layer over the transparent conductive oxide layer, wherein the nanowires infused transparent window layer has a first thickness at certain areas and a second thickness different from the first thickness at other areas, wherein the nanowires infused transparent window layer form a percolating network to conduct laterally across the nanowires infused transparent window layer and wherein overall sheet resistance of the nanowires infused transparent window layer is between about 1 to 10 ohms per square, while light transmission combined is at least 70% and creates less than 5% shadow loss.

2. The method of claim 1 wherein the transparent conductive oxide layer is comprised of Al—ZnO.

3. The method of claim 1 wherein the transparent conductive oxide layer is comprised of ZnO or ZnMO.

4. The method of claim 1 wherein the transparent conductive oxide layer is comprised of ITO.

5. The method of claim 1 wherein the solution comprises of between 0.5 to 1.0% by weight of metal nanowires in a solvent with 0.5 to 1.0% binder.

6. The method of claim 1 wherein the solution comprises of between 0.1 to 2.0% by weight of metal nanowires in a solvent with 0.2 to 1.5% binder.

7. The method of claim 1 wherein the nanowires each have a length between 10 to 100 microns and diameter of 20 to 200 nm.

8. The method of claim 1 wherein the nanowires each have a length between 50 to 200 microns and diameter of 50 to 200 nm.

9. The method of claim 1 wherein maximum horizontal distance between areas of first thickness of higher electrical conductivity is at least 10% less than a diameter of the via.

10. The method of claim 1 wherein maximum horizontal distance between areas of first thickness of higher electrical conductivity is at least 20% less than a diameter of the via.

11. The method of claim 1 wherein maximum horizontal distance between areas of first thickness of higher electrical conductivity is at least 30% less than a diameter of the via.

12. The method of claim 1 where difference between first thickness and second thickness is achieved by printing a uniform thickness layer conforming to the second thickness and printing an additional layer at pre-determined areas to increase aggregate thickness to the first thickness.

13. The method of claim 1 wherein depressions created by the reduced thickness of the second thickness creates cavities on an upper surface of the nanowires infused window layer.

14. The method of claim 1 wherein an underlying layer of material is shaped to have large plateau areas and narrow valley areas which created areas of increased thickness for higher conductivity.

15. The method of claim 1 wherein the first thickness is greater than the second thickness, wherein the first thickness also has increased nanowire density due to application of a different solution of nanowires in those areas of the first thickness.

16. The method of claim 1 wherein the first thickness is greater than the second thickness, wherein light transmission is at least 50% in areas of the first thickness.

17. The method of claim 1 wherein the first thickness is greater than the second thickness, wherein light transmission is at least 60% in areas of the first thickness.

18. The method of claim 1 wherein no opaque grid lines are used and wherein the first thickness is greater than the second thickness, wherein light transmission is at least 50% in areas of the first thickness.

19. The method of claim 1 wherein two or more coating steps are used to create areas of greater thickness.

* * * * *